United States Patent
Wang et al.

(10) Patent No.: US 8,933,481 B2
(45) Date of Patent: Jan. 13, 2015

(54) LEAD FRAME ASSEMBLY, LED PACKAGE AND LED LIGHT BAR

(71) Applicants: Lite-On Electronics (Guangzhou) Limited, Guangzhou (CN); Lite-On Technology Corp., Taipei (TW)

(72) Inventors: Chiou-Yueh Wang, Taipei (TW); Chen-Hsiu Lin, Taipei (TW); Shih-Chang Hsu, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 13/850,375

(22) Filed: Mar. 26, 2013

(65) Prior Publication Data

US 2013/0270588 A1 Oct. 17, 2013

(30) Foreign Application Priority Data

Apr. 11, 2012 (CN) .......................... 2012 1 0104900

(51) Int. Cl.

| H01L 33/62 | (2010.01) |
|---|---|
| H01L 23/495 | (2006.01) |
| H01L 27/15 | (2006.01) |
| H01L 25/075 | (2006.01) |
| F21K 99/00 | (2010.01) |
| F21S 4/00 | (2006.01) |
| F21Y 101/02 | (2006.01) |
| F21Y 103/00 | (2006.01) |

(52) U.S. Cl.
CPC .............. *H01L 33/62* (2013.01); *H01L 23/495* (2013.01); *H01L 27/153* (2013.01); *H01L 25/0753* (2013.01); *H01L 2224/48091* (2013.01); *H01L 2224/48247* (2013.01); *F21K 9/00* (2013.01); *F21S 4/003* (2013.01); *F21Y 2101/02* (2013.01); *F21Y 2103/003* (2013.01)
USPC .............. 257/99; 257/E23.043; 257/E33.061; 257/E33.072; 257/676; 257/91; 257/98

(58) Field of Classification Search
USPC ........ 257/676, 98, E33.06, 99, 666, E23.043, 257/E33.061, E33.072, 81
See application file for complete search history.

(56) References Cited

U.S. PATENT DOCUMENTS

| 8,378,347 | B2 * | 2/2013 | Shimizu et al. | 257/48 |
|---|---|---|---|---|
| 8,440,478 | B2 * | 5/2013 | Hayashi | 438/26 |
| 8,530,250 | B2 * | 9/2013 | Ichikawa et al. | 438/26 |
| 2002/0071253 | A1 * | 6/2002 | Lam et al. | 361/704 |
| 2011/0186901 | A1 * | 8/2011 | Ushiyama et al. | 257/99 |
| 2011/0210354 | A1 * | 9/2011 | Ichikawa et al. | 257/98 |
| 2012/0132949 | A1 * | 5/2012 | Watari et al. | 257/99 |
| 2012/0161180 | A1 * | 6/2012 | Komatsu et al. | 257/98 |
| 2012/0235287 | A1 * | 9/2012 | Karim et al. | 257/676 |

(Continued)

*Primary Examiner* — Alexander Oscar Williams
(74) *Attorney, Agent, or Firm* — Rosenberg, Klein & Lee

(57) ABSTRACT

A lead frame assembly includes a surrounding frame and a plurality of lead frame sets arranged in a matrix. Each lead frame set includes spaced-apart first and second lead frames and a connecting structure interconnecting one of the lead frame sets to an adjacent lead frame set. Each lead frame set is further connected to the surrounding frame through the connecting structure thereof. A plurality of insulated bars are spacedly formed on a lead frame panel. Each insulated bar covers a corresponding row of the lead frame sets and exposes bottom surfaces of the first and second lead frames. Each insulated bar further covers portions of the surrounding frame that are adjacent to two opposite outermost ones of the lead frame sets.

10 Claims, 11 Drawing Sheets

(56) References Cited

U.S. PATENT DOCUMENTS

| | | | |
|---|---|---|---|
| 2013/0256733 A1* | 10/2013 | Lin et al. | 257/99 |
| 2013/0299854 A1* | 11/2013 | Lee et al. | 257/88 |
| 2014/0027801 A1* | 1/2014 | Hussell | 257/91 |
| 2014/0159098 A1* | 6/2014 | Chen | 257/99 |
| 2014/0217434 A1* | 8/2014 | Hussell et al. | 257/89 |

* cited by examiner

LEAD FRAME ASSEMBLY, LED PACKAGE AND LED LIGHT BAR

CROSS-REFERENCE TO RELATED APPLICATION

This application claims priority of Chinese Patent Application No. 201210104900.1, filed on Apr. 11, 2012.

FIELD OF THE INVENTION

This invention relates to a lead frame assembly for a no-lead package, more particularly to a lead frame assembly for packaging LED dies using Quad Flat No-lead (QFN) technology and LED package and LED light bar formed therefrom.

DESCRIPTION OF THE RELATED ART

A conventional method for packaging light emitting diode (LED) dies using QFN technology includes etching firstly a metallic substrate to form a plurality of lead frame sets that are arranged in an array, and then forming a plurality of insulated housings that correspond respectively to the lead frame sets on the metallic substrate by injection molding, thereby forming a lead frame assembly. Each of the lead frame sets is provided for disposing an LED die. The lead frame assembly is singulated into a plurality of LED packages after singulation process. Each of the LED packages includes a lead frame set and an insulated housing.

However, the conventional lead frame assembly for QFN package has the insulated housings mutually connected, thereby forming a plastic structure with a large area. Since the thermal expansion coefficient of a plastic structure made of plastic material differs from metallic substrate made of a metal material, during formation of the insulated housings, warping of the lead frame assembly is likely to be generated. Additionally, because of the long-time curing during the packaging process, the warping problem is aggravated. This leads to a high damage rate of the LED package, thereby adversely affecting the reliability of the package product.

Moreover, an LED die usually cooperates with a phosphor layer to form an LED package for generating light. When the LED die is cooperated with the phosphor layer, the LED die must be lighted for achieving the bin target by currently adjusting the distribution area of a phosphor layer. Since the lead frame sets of the conventional lead frame assembly are mutually connected, that is, the lead frame sets are electrically connected, thus it is difficult to directly light the single package on the lead frame assembly for testing whether the LED package is in-bin or not. Hence, it is necessary to cut the lead frame assembly into individual single package before testing each package.

SUMMARY OF THE INVENTION

Therefore, an object of the present invention is to provide a lead frame assembly for a quad flat no lead (QFN) package that is not easily warped.

Another object of the present invention is to provide a lead frame assembly for a QFN package that can permit direct testing thereon.

Yet another object of the present invention is to provide a QFN LED package.

Still another object of the present invention is to provide a light emitting diode (LED) light bar that includes a plurality of interconnected LED packages.

The effect of the present invention resides in that the lead frame assembly according to this invention can reduce residual stress and warping problem caused by the difference of thermal expansion coefficient between metal and insulating materials, and can minimize the consumption of insulating materials so as to save the material costs. Furthermore, each of the lead frame sets can be electrically isolated so that a direct lighting can be conducted on the lead frame assembly, thereby facilitating package in-bin issue. Moreover, the weight and distribution area of a phosphor layer can be immediately adjusted according to the result of the testing to enhance accuracy of the position of the color coordinates of a single light emitting diode package.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Figure 1:
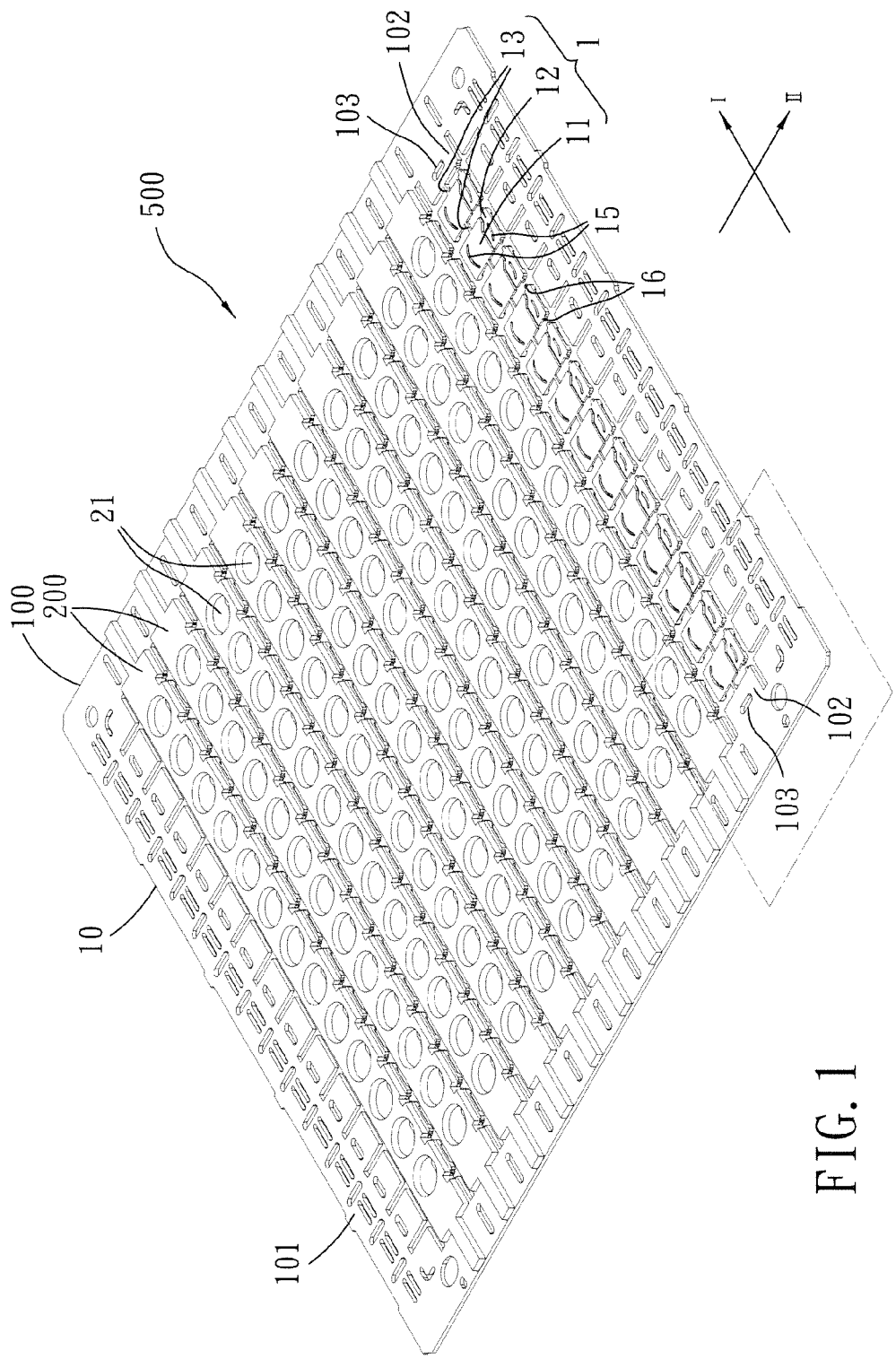
FIG. 1 is a perspective view of a lead frame assembly according to the preferred embodiment of this invention.

The above-mentioned and other technical contents, features, and effects of this invention will be clearly presented from the following detailed description of the preferred embodiment in coordination with the reference drawings.

Referring to FIGS. 1 to 4, the preferred embodiment of a lead frame assembly 500 according to this invention is suitable for packaging a plurality of light emitting diode (LED) dies 9 (see FIG. 6), and comprises a lead frame panel 100 and a plurality of insulated bars 200. The insulated bar 200 at the rightmost row of the lead frame substrate 100 is removed in FIGS. 1 to 4 for the sake of convenience and clarity, and the parts of the insulated bar 200 are indicated by shading in FIGS. 3 and 4 so as to distinguish from that of the lead frame panel 100.

The lead frame panel 100 is formed by etching a metal plate and includes a surrounding frame 10 and a plurality of lead frame sets 1. The lead frame sets 1 are arranged in a matrix within the surrounding frame 10. Each of the lead frame sets 1 includes a first lead frame 11, a second lead frame 12 spaced apart from the first lead frame 11, and a connecting structure. The connecting structure of each lead frame set 1 includes a plurality of connecting pieces 13 and 16. The connecting pieces 13 of each lead frame set 1 extend outwardly and respectively from two opposite sides of the first lead frames 11 along a first direction (I), and interconnect the first lead frames 11 of each two adjacent ones of the lead frame sets 1 along the first direction (I). The connecting pieces 16 of each lead frame set 1 extend outwardly and respectively from two opposite sides of the second lead frame 12 along the first direction (I). Preferably, the locations of the connecting pieces 13, 16 of are symmetric such that each of adjacent lead frame sets can be connected through the connecting pieces 13, 16. The connecting pieces 16 of each two adjacent ones of the lead frame sets 1 are disconnected. The first lead frames 11 of two opposite outermost ones of the lead frame sets 1 are further connected to the surrounding frame 10 through the connecting pieces 13. In this embodiment, the first lead frame 11 and the second lead frame 12 of each lead frame set 1 are spaced apart from each other along a second direction (II) that is perpendicular to the first direction (I).

The insulated bars 200 are molded over the lead frame panel 100 in a spaced apart manner. Each of the insulated bars 200 covers one row of the lead frame sets 1 along the first direction (I) and covers portions of the surrounding frame 10 that are adjacent to two opposite outermost ones of the lead frame sets 1 of the corresponding row. The first lead frame 11 of each lead frame set 1 includes a first base portion 111 connected to one of the insulated bars 200 and having a first protruding portion 112 exposed from the corresponding insulated bar 200. The second lead frame 12 of each lead frame set 1 includes a second base portion 121 connected to the corresponding insulated bar 200 and having a second protruding portion 122 exposed from the corresponding insulated bar 200. The first and second protruding portions 112, 122 are opposite to each other along the second direction (II). The first base portion 111 further has opposite top and bottom surfaces 113, 114. Two dies 9 are disposed on the top surface 113 of the first base portion 111 of each lead frame set 1. The second base portion 121 also further has opposite top and bottom surfaces 123, 124. The top surface 113 of the first base portion 111 and the top surface 123 of the second base portion 121 are electrically connected to the dies 9. The bottom surface 114 of the first base portion 111 and the bottom surface 124 of the second base portion 121 are used for soldering to a circuit board (not shown).

Each of the lead frame sets 1 further includes a plurality of stepped structures 141 respectively formed on a portion of a bottom peripheral edge of the first base portion 111 and a portion of a bottom peripheral edge of the second base portion 121, a plurality of indentations 142 respectively formed in the bottom surfaces 114, 124 of the first and second base portions 111, 121 at positions corresponding to the first and second protruding portions 112, 122, respectively. The stepped structures 141 are filled with the materials of the insulated bar 200 such that the bottom surfaces 114, 124 of the first and second base portions 111, 121 are exposed. Hence, connection between each insulated bar 200 and the corresponding row of the lead frame sets 1 can be enhanced. The indentations 142 are filled with solder materials (not shown) to enhance a strong connection between the lead frame sets 1 and the circuit board. Furthermore, each lead frame set 1 further includes two arc-shaped blind holes 15 respectively formed in the top surfaces 113, 123 of the first and second base portions 111, 121 and filled with the materials of the insulated bar 200 so as to strengthen the connection between each insulated bar 200 and the corresponding row of the lead frame sets 1. In this embodiment, each of the top surfaces 113, 123 of the first and second lead frames 11, 12 is formed with one arc-shaped blind hole 15. In an alternative embodiment, each of the top surfaces 113, 123 of the first and second lead frames 11, 12 may be formed with a plurality of blind holes 15 having other shapes.

The surrounding frame 10 of the lead frame panel 100 has an outer frame portion 101 and a plurality of extension portions 102 extending inwardly from the outer frame portion 101 and connected respectively to the first lead frames 11 of the outermost ones of the lead frame sets 1. Each of the extension portions 102 is formed with at least one through hole 103. In this embodiment, each extension portion 102 is formed with only one through hole 103. Alternatively, each extension portion 102 may be formed with a plurality of through holes 103. Each insulated bar 200 has two opposite end portions that respectively cover two of the extension portions 102 that are connected to the two opposite outermost ones of the lead frame sets 1 of the corresponding row. The materials of the insulated bar 200 are filled into the through holes 103 in the two extension portions 102, thereby further enhancing the connection between each insulated bar 200 and the surrounding frame 10.

Figure 5:
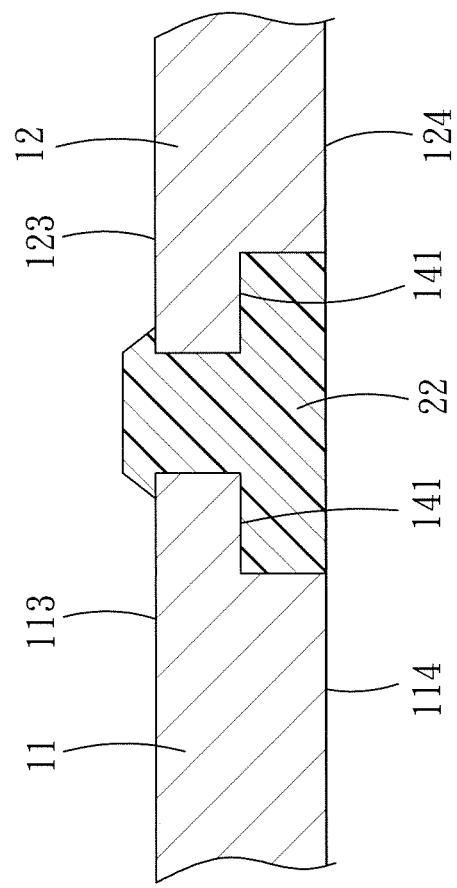
FIG. 5 is an enlarged fragmentary sectional view of a lead frame set of the preferred embodiment, illustrating how a filling portion is filled into a space between first and second lead frames of the lead frame set.

In this embodiment, each insulated bar 200 has a plurality of recesses 21. Each of the recesses 21 exposes partially the top surfaces 113, 123 of the first and second lead frames 11, 12 of the corresponding lead frame set 1. Each insulated bar 200 further has a plurality of filling portions 22 (see FIGS. 3 to 5). Each of the filling portions 22 is filled into a space between the first and second lead frames 11, 12 of the corresponding lead frame set 1. Each filling portion 22 protrudes from and extends toward the top surfaces 113, 123 of the first and second lead frames 11, 12 to partially cover the same, so that penetration of moisture from a bottom portion of the lead frame set 1 can be prevented. If a flip-chip type die is to be packaged, the filling portion 22 should not be higher than the top surfaces 113, 123 of the first and second lead frames 11, 12.

The insulated bars 200 are spaced apart and disconnected from each other along the second direction (II). That is, each insulated bar 200 extends along the first direction (I), and is disconnected from an adjacent one of the insulated bars 200 along the second direction (II). This can prevent a large area connection of insulating materials, and reduce residual stress and warping problem caused by the difference between thermal expansion coefficients of metal and insulating materials. Further, the consumption of the insulating materials can also be reduced to save material costs. Moreover, in this embodiment, each insulated bar 200 is made from a mixture of a plastic material and a filling material. The filling material may be selected from the group consisting of glass fiber, carbon fiber, boron nitride, magnesium oxide, zinc oxide, silicon dioxide, titanium dioxide, aluminum oxide, silicon carbide, talc, mica, calcium carbonate, barium carbonate, and magnesium carbonate. The content of the filling material is at least 60% by weight, preferably 80% by weight, so that the difference between the thermal expansion coefficients of the insulating and metal materials can be reduced, thereby minimizing the warping problem. In other embodiments, each insulated bar 200 may be made of silicone, epoxy, hybrid silicone, or acrylic).

Figure 2:
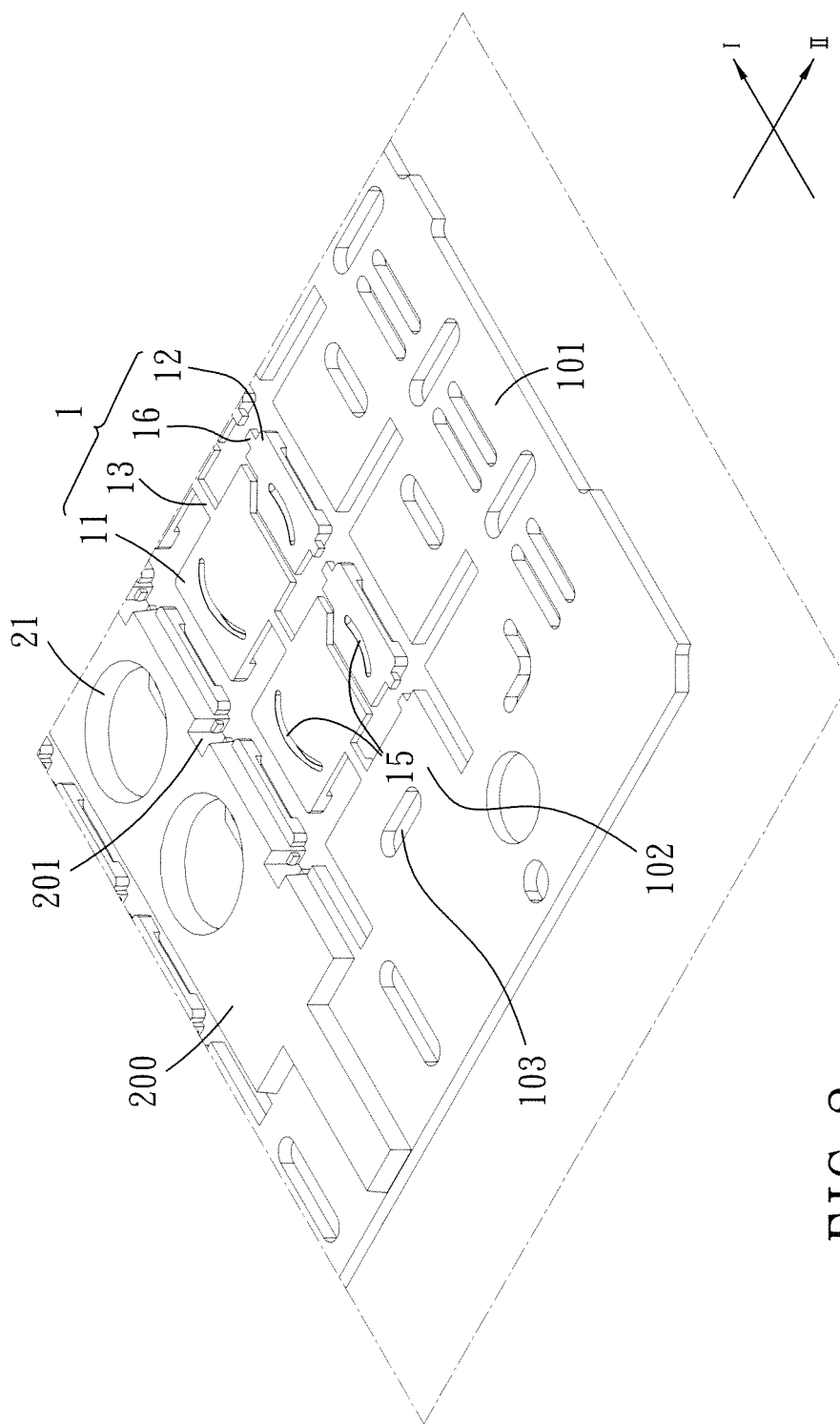
FIG. 2 is a partial enlarged perspective view of FIG. 1.
Figure 3:
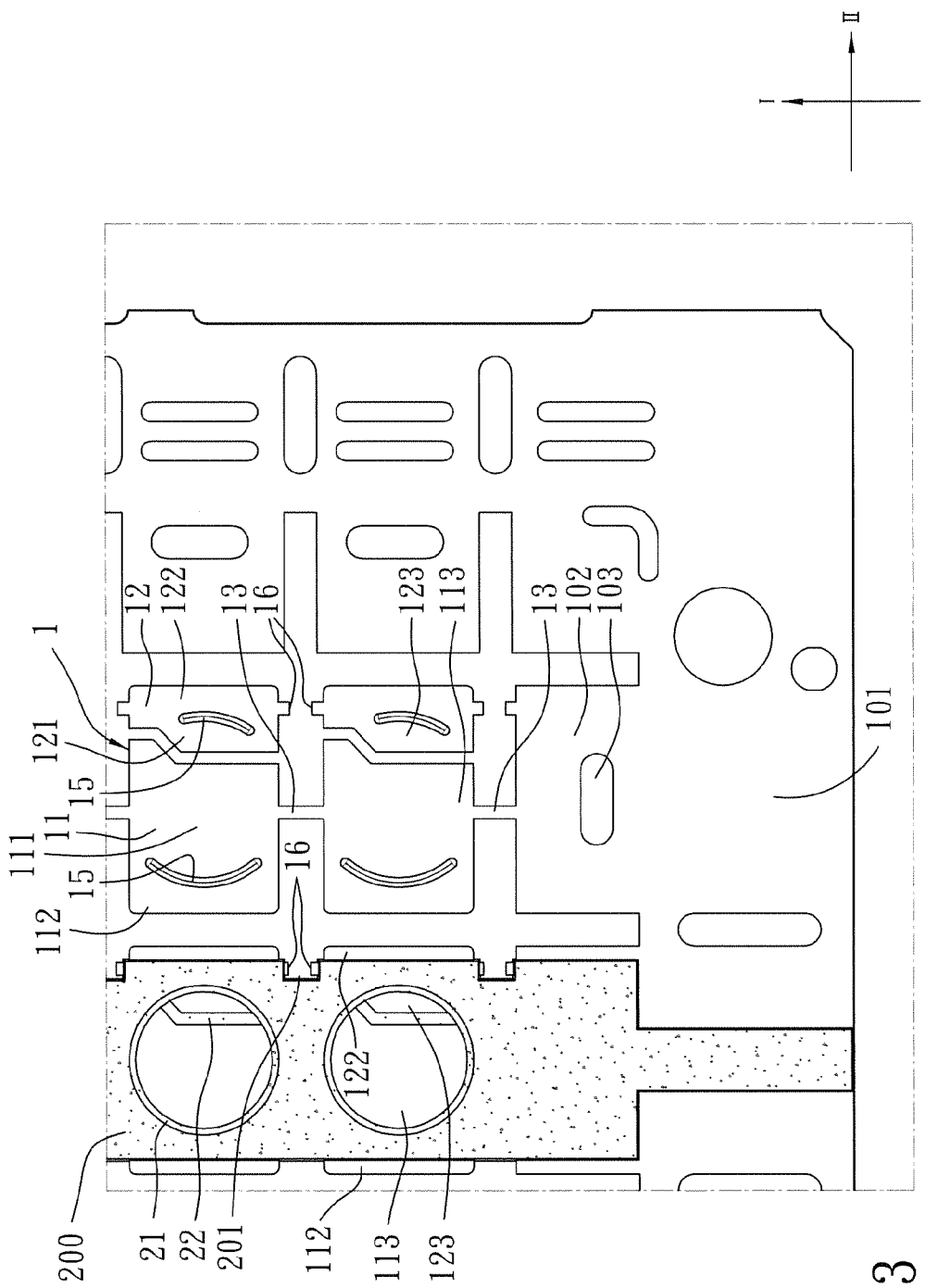
FIG. 3 is a schematic top view of FIG. 2.
Figure 4:
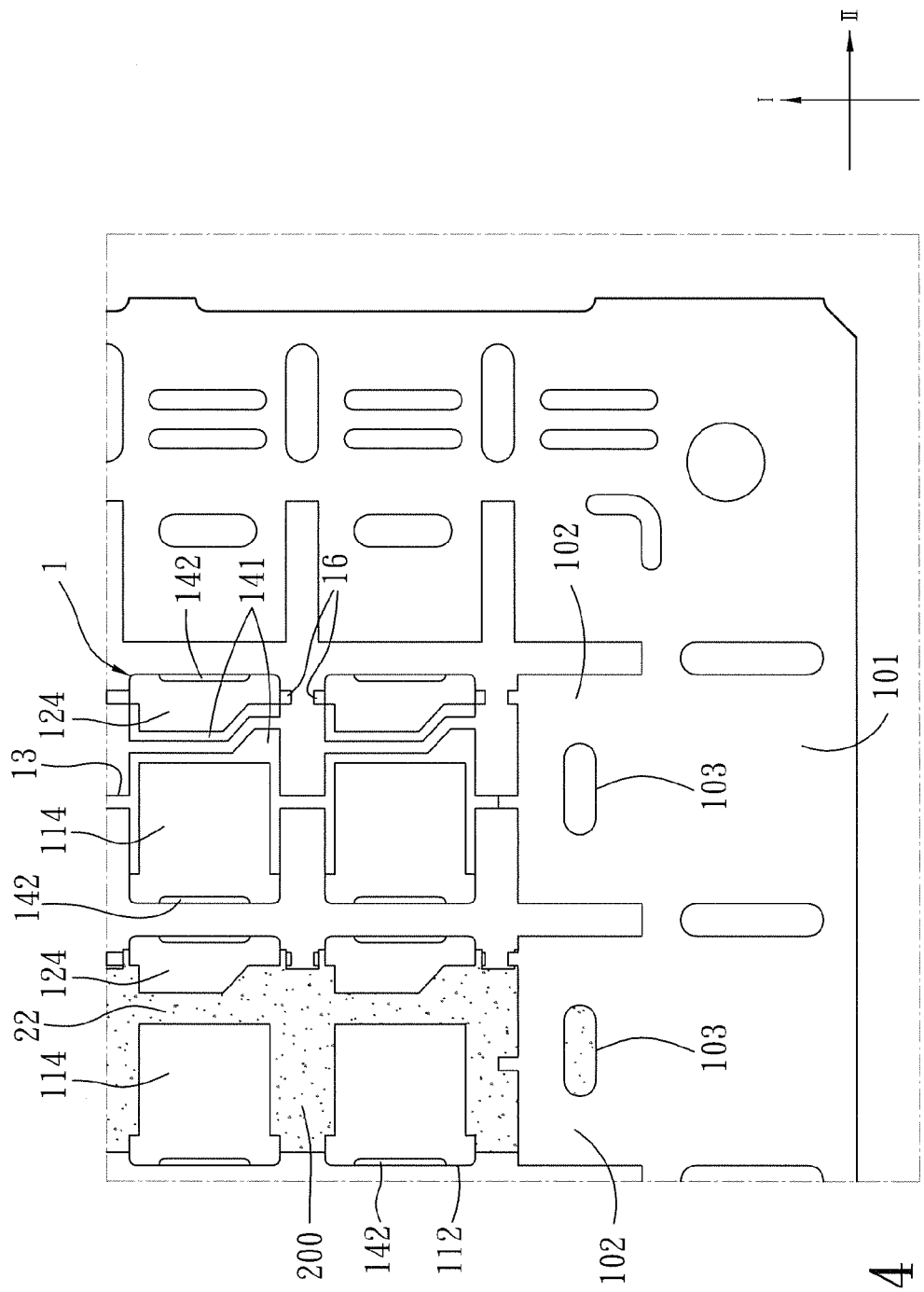
FIG. 4 is a schematic bottom view of FIG. 3.

In this embodiment, each insulated bar 200 further has a plurality of notches 201 (see FIGS. 2 and 3). Each of the notches 201 corresponds in position to the connecting pieces 16 of each two adjacent ones of the lead frame sets 1. Each notch 201 is used to facilitate cutting of the connecting pieces 16 between each two adjacent ones of the lead frame sets 1 during forming of each insulated bar 200 so that the second lead frame 12 of each lead frame set 1 is electrically isolated. That is, each two adjacent ones of the lead frame sets 1 are not electrically connected to each other, so that testing of a single package on the lead frame assembly can be conducted. It should be noted that the single package can be immediately tested (such as optical characteristics) on the lead frame assembly 500 without having to cut the lead frame assembly 500 into individual single packages. This can facilitate the work of package testing. This is, this can facilitate immediate correction of positions of color coordinates of LED package during light testing. Therefore, it enhances the accuracy of position of the color coordinates of the single LED package.

In this embodiment, each insulated bar 200 extends along the first direction (I) to match and be consistent with the extending direction of the connecting structures of the lead frame sets 1. Further, by disconnection of the connecting pieces 16 between the second lead frames 12 of each two adjacent ones of the lead frame sets 1 so that the second lead frame 12 of each lead frame set 1 is electrically isolated. Further, connection between the connecting pieces 13 of the first lead frames 11 of each two adjacent ones of the lead frame sets 1 is retained to strengthen the structural strength and prevent fracture of each insulated bar 200. Moreover, because each insulated bar 200 is already separated from an adjacent one of the insulated bars 200 in the second direction (II) during forming, and because the lead frame sets 1 are disconnected along the second direction (II), each insulated bar 200 and the connecting pieces 13 between the first lead frames 11 of each two adjacent ones of the lead frame sets 1 can be cut simultaneously along the second direction (II) to form a single package. There is no need to cut along the first direction (I) so that occurrence of burrs due to cutting can be reduced and the cost of tool wear can also be reduced. Alternatively, each insulated bar 200 may also be disposed along the second direction (II) to similarly achieve the effect of minimizing the warping problem, but additional cutting process may be required. Additionally, the connecting structure of each lead frame set 1 may further include connecting pieces (not shown) extending along the second direction (II). That is, the connecting pieces of each lead frame set 1 may extend along the first and second directions (I), (II), so that not only the lead frame sets 1 that extend along the first direction (I) are interconnected, but also the lead frame sets 1 that extend along the second direction (II) are interconnected. Hence, supporting strength of the lead frame assembly 500 can be enhanced, but additional cutting process may be required.

Figure 6:
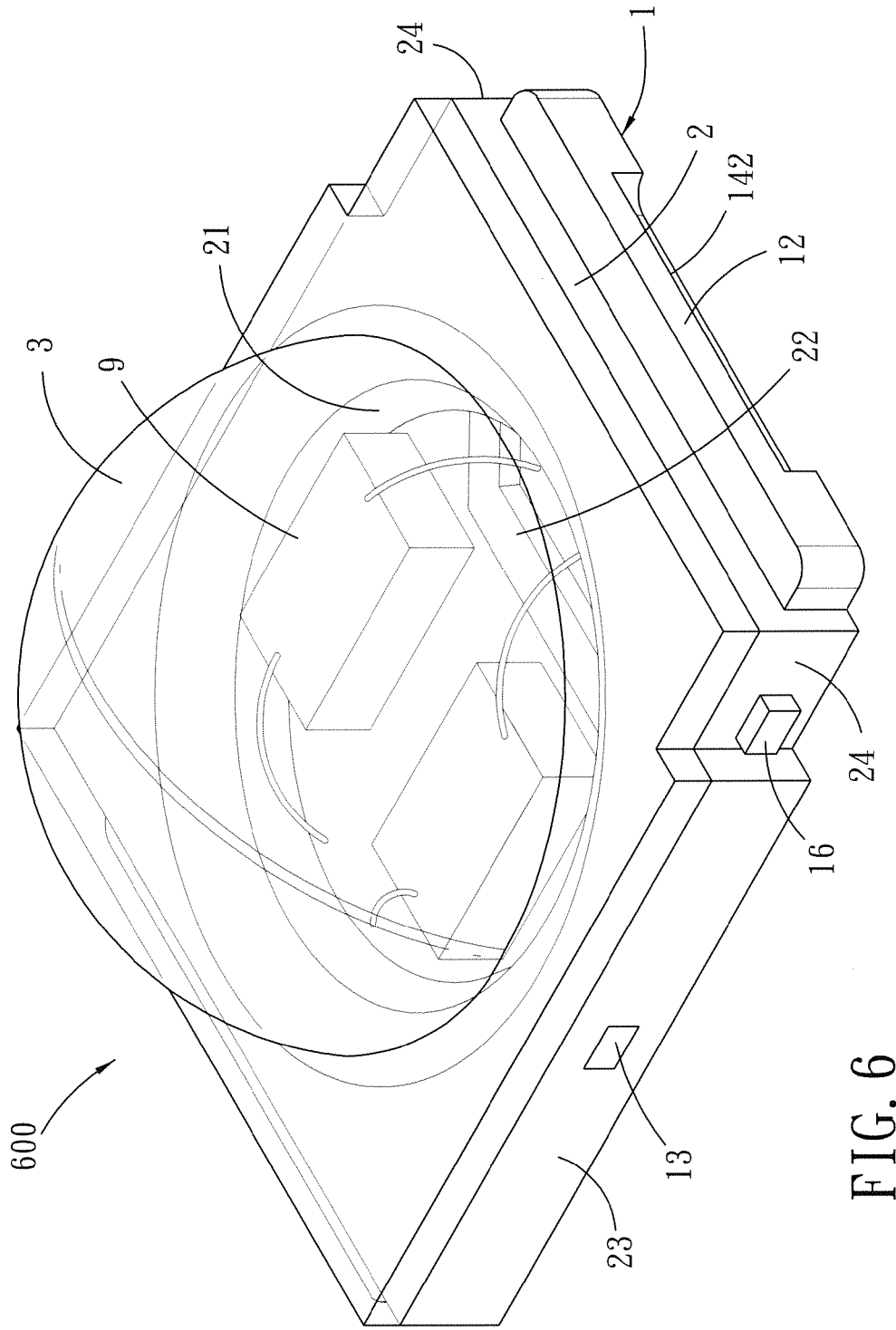
FIG. 6 is a perspective view of a single LED package of the preferred embodiment.
Figure 10:
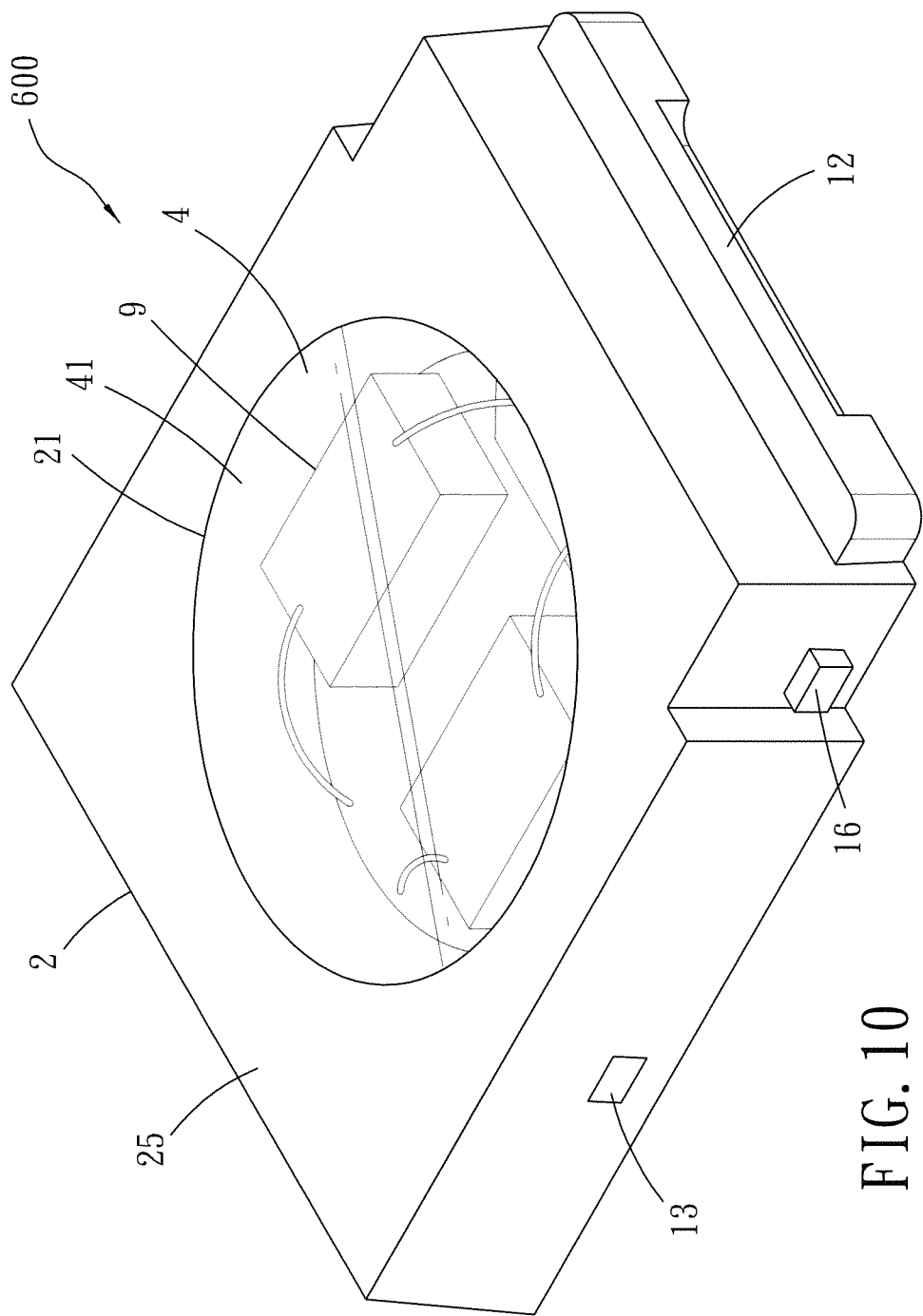
FIG. 10 is a perspective view of an alternative form of the light emitting diode package unit of the preferred embodiment.
Figure 11:
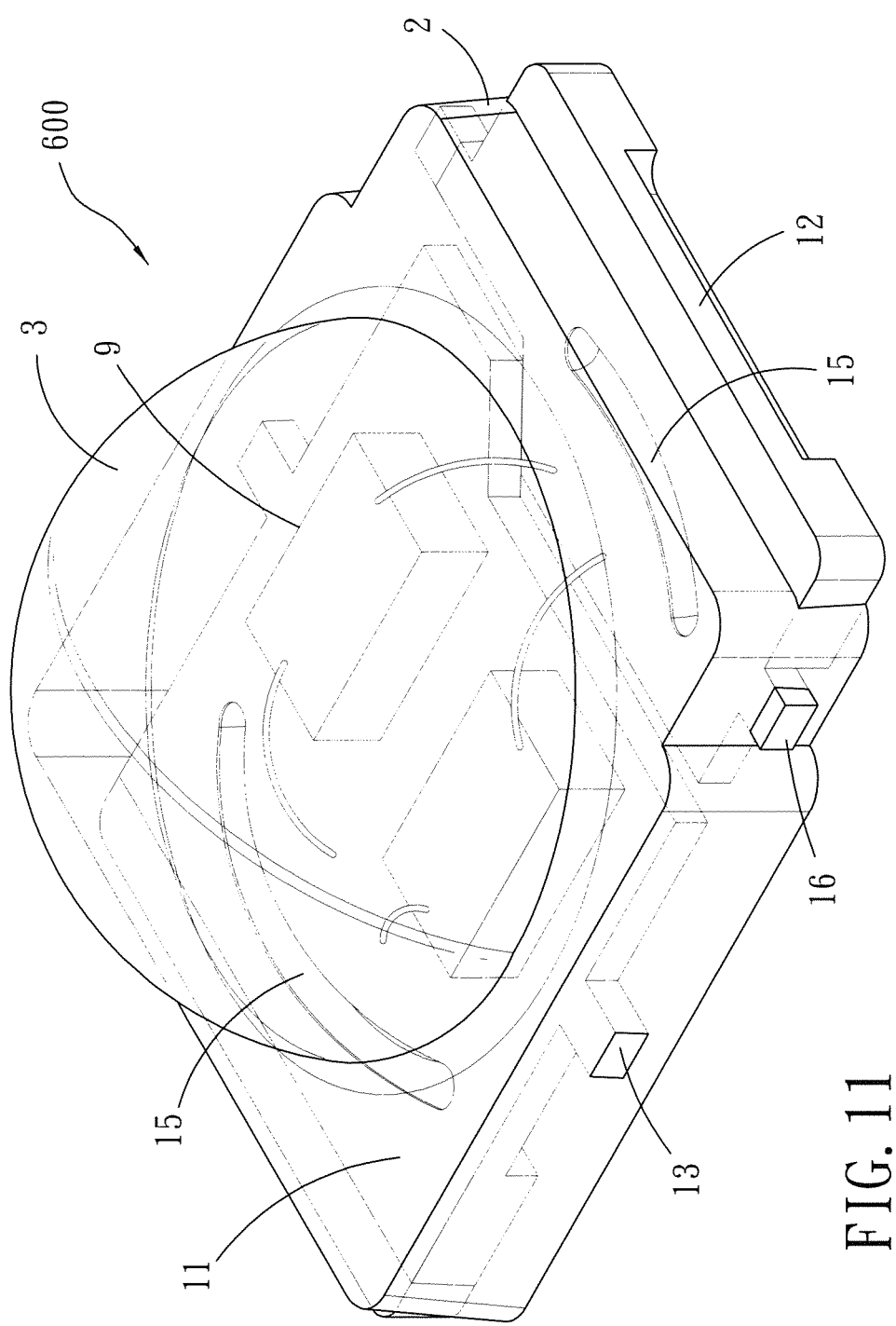
FIG. 11 is a perspective view of another alternative form of the LED package of the preferred embodiment.
Figure 12:
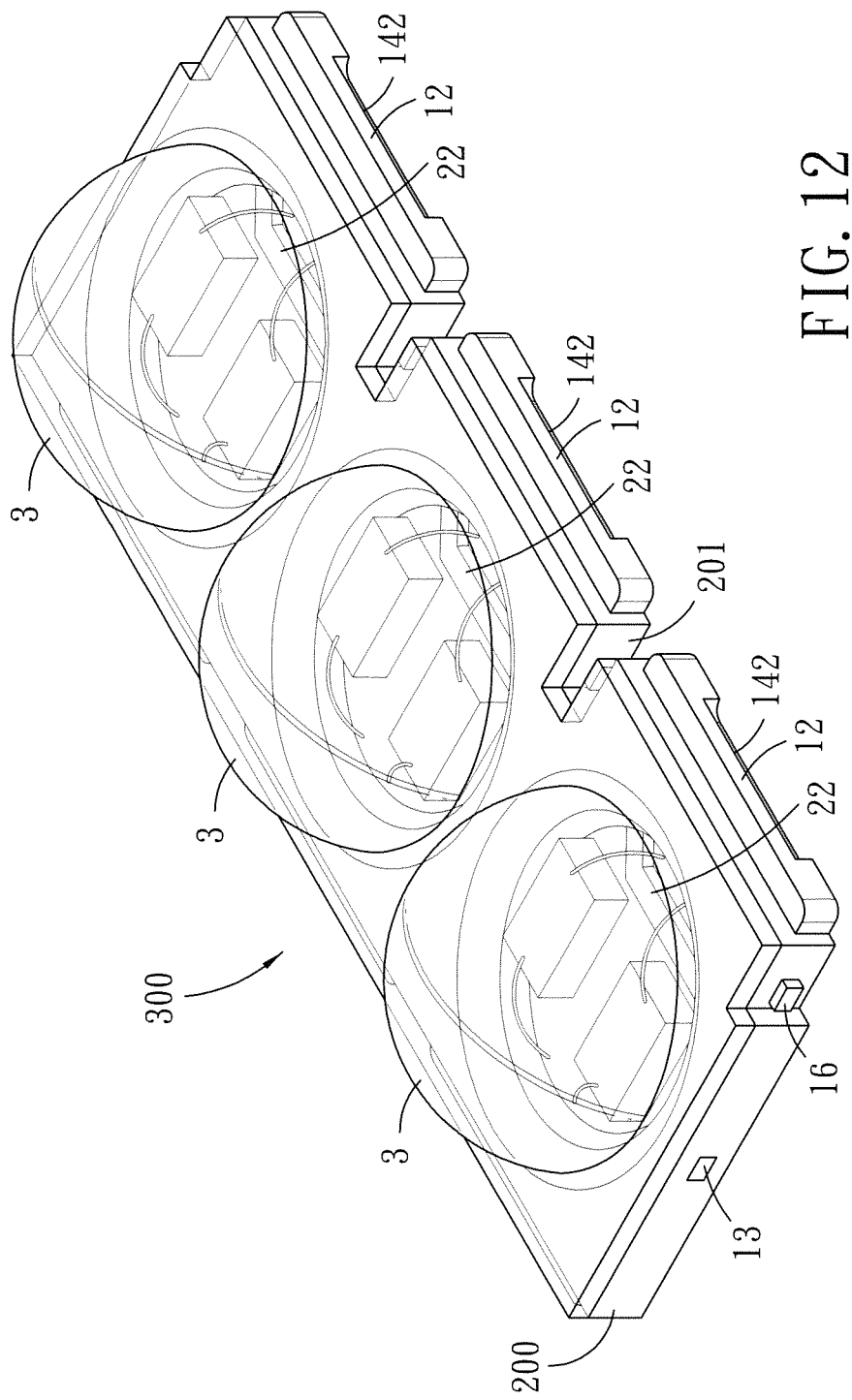
FIG. 12 is a perspective view of an LED light bar of the preferred embodiment.

The lead frame assembly 500 of the present invention can be further formed with a plurality of lens body 3 (only one is shown in FIG. 6) after the dies 9 and a fluorescent layer (not shown) are provided on each lead frame set 1, or a plurality of transparent bodies 4 (only one is shown in FIG. 10) by filling transparent materials (such as silicone) into the recesses 21 of each insulated bar 200 such that the transparent materials is coplanar with the top surface 25 of the transparent body 4. Or, after the dies 9 are provided on each lead frame set 1, a transparent material (such as silicone) may be molded over the lead frame assembly 500 to form a plurality of transparent insulated bars (not shown) each including an insulated housing 2 and a lens body 3 (see FIG. 11). Exactly, the insulated housing 2 and the lens body 3 are formed with one body shape on the lead frame assembly. A cutting process is performed after testing to form a plurality of LED light bars 300 (only one is shown in FIG. 12) or a plurality of LED packages 600 (only one is shown in FIGS. 6, 10 and 11). The fluorescent layer may be directly coated on the dies 9 before the lens body 3 is formed thereon, or may be uniformly mixed with the transparent material before being filled into the recess 21. Both can achieve an effect of mixed light.

Figure 8:
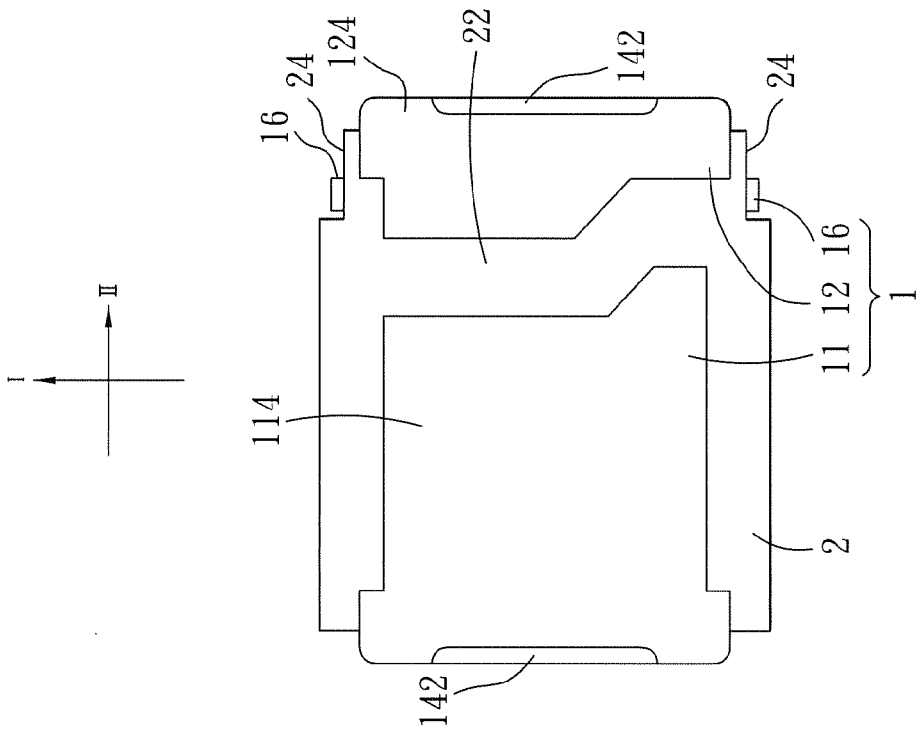
FIG. 8 is a schematic bottom view of FIG. 6.
Figure 7:
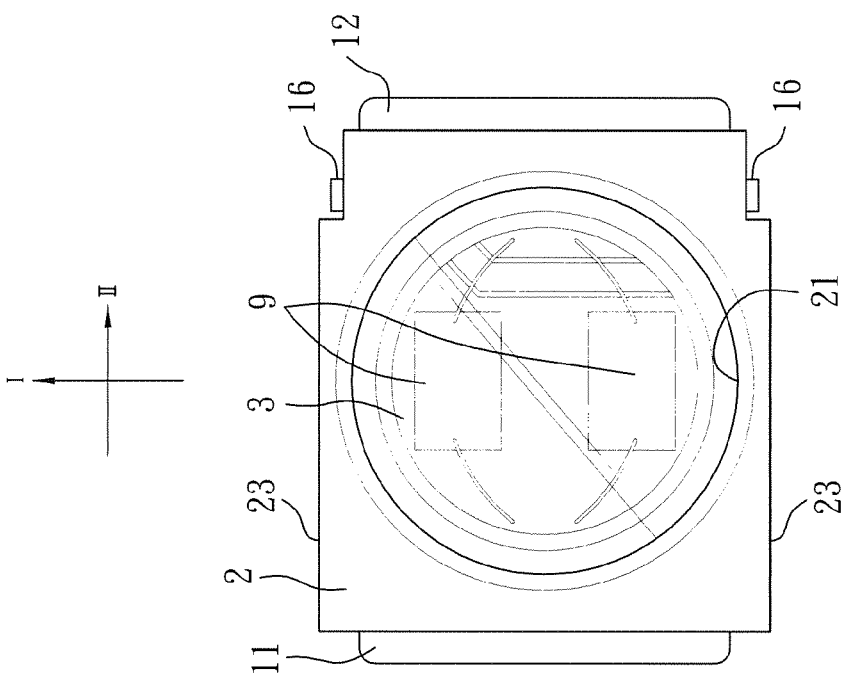
FIG. 7 is a schematic top view of FIG. 6.

Referring to FIGS. 6 to 8, the preferred embodiment of an LED package 600 according to this invention comprises a lead frame set 1, an insulated housing 2, a lens body 3, and two dies 9. One of the dies 9 may be a Zener diode to provide the other die 9 with an electrostatic discharge (ESD) protection.

The lead frame set 1 (that is the lead frame set 1 of the lead frame assembly 500) includes a first lead frame 11, a second lead frame 12, and a plurality of connecting pieces 13 and 16. The first and second lead frames 11, 12 are spacedly arranged along the second direction (II) (see FIGS. 1 and 2), and the connecting pieces 13, 16 extend outwardly and correspondingly from two opposite sides of the first and second lead frames 11, 12 along the first direction (I) (see FIGS. 1 and 2). Since the other specific structures of the lead frame set 1 are identical to that described in the aforesaid lead frame assembly 500, a detailed description thereof is omitted herein for the sake of brevity.

The insulated housing 2 is formed from cutting the insulated bar 200 of the lead frame assembly 500. The connecting pieces 13 between the first lead frames 11 of each two adjacent ones of the lead frame sets 1 are also cut during cutting of the insulated bar 200 such that end surfaces of the connecting pieces 13 are respectively flush with two opposite lateral surfaces of the insulated housing 2. Further, the notches 201 of the insulated bar 200 correspond to indented corners 24 of the insulated housing 2 of each LED package 600. That is, the insulated housing 2 has two indented corners 24 that respectively expose the connecting pieces 16 of the second lead frames 12 from the insulated housing 2. Moreover, the insulated housing 2 has the recess 21 and the filling portion 22. The recess 21 exposes the top surfaces 113, 123 of the first and second lead frames 11, 12. The filling portion 22 is the filling portion 22 of the lead frame assembly 500 and thus a detailed description of the same is omitted. The dies 9 are disposed on the top surface 113 of the first lead frame 11, and are electrically connected to the lead frame set 1. The lens body 3 encapsulates the recess 21 and the dies 9. The number of the die 9 may be one or more, and is not limited to this embodiment.

Figure 9:
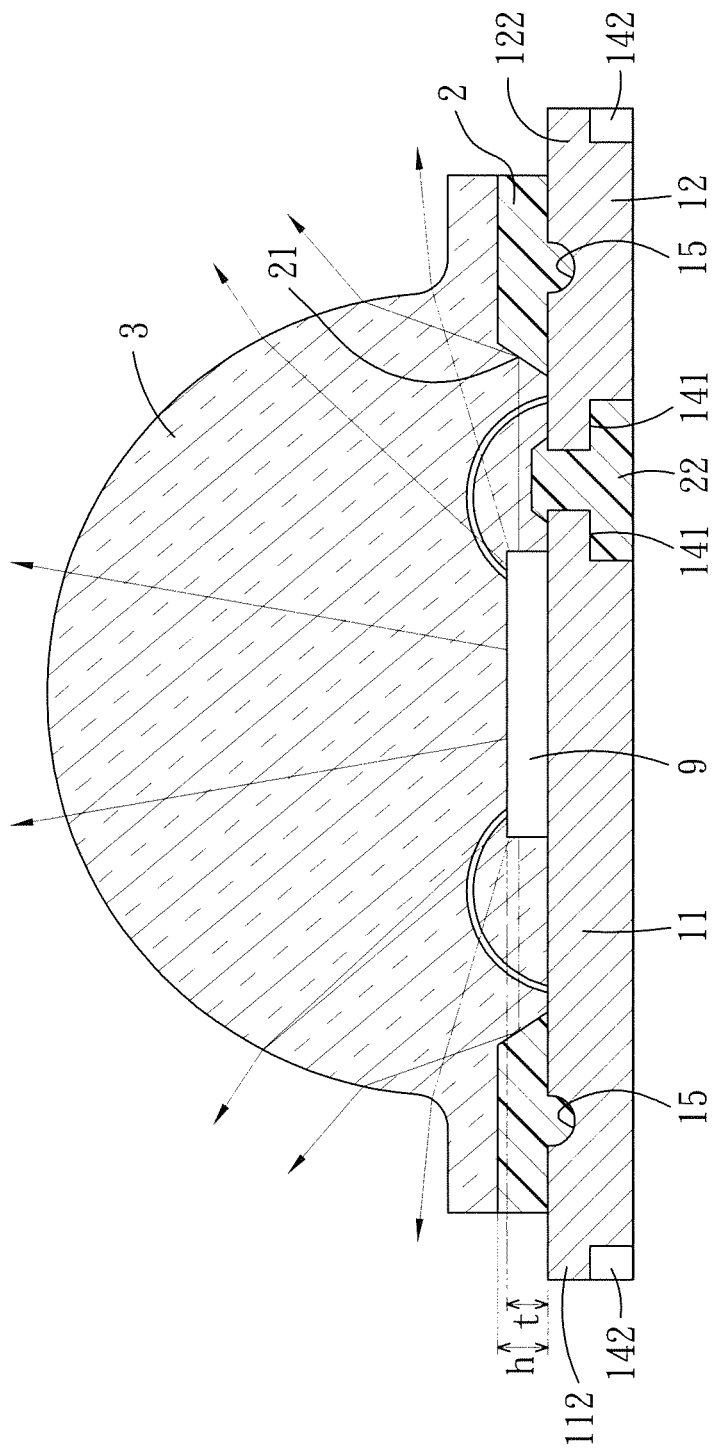
FIG. 9 is a sectional side view of FIG. 6.

Referring to FIG. 9, in this embodiment, the recess 21 tapers downwardly and has a shorter height (h) that has a radial angle about 70 degrees defined by the two inclined surfaces of the insulated housing 2 from the cross-section view of FIG. 9. The recess 21 has the height (h) ranging from 0.5 to 1.5 times the thickness (t) of the die 9. The height (h) may be based on the thickness (t) of the die 9. Since the height (h) of the recess 21 is not higher than 1.5 times the thickness (t) of the die 9, the amount of light irradiated from the die 9 and absorbed by the insulated housing 2 can be reduced so as to reduce deterioration of the insulating material, thereby increasing the service life and reliability of the insulated housing 2.

FIG. 10 illustrates an alternative form of the LED package 600 of this invention. In this embodiment, the recess 21 of the insulated housing 2 has a height larger than 1.5 times the thickness of the die 9 so that the recess 21 is deeper, can reflect more lateral beams from the dies 9, and can generate a better luminance uniformity over the aforesaid recess 21. The recess 21 is filled with a transparent body 4 to seal the dies 9. A top surface 41 of the transparent body 4 is flush with a top surface 25 of the insulated housing 2. Alternatively, the recess 21 may be covered with an optical lens so that the light emitting diode package can generate better luminance uniformity.

FIG. 11 illustrates another alternative form of the LED package 600. The LED package 600 is similar to the LED package shown in FIG. 6. However, in this embodiment, the insulated housing 2 and the lens body 3 are integrally formed as one piece using a transparent material. The process of making the LED package 600 of this embodiment involves the step of disposing the dies first on the lead frame sets 1, after which a transparent material is molded over the lead frame sets 1 so that the insulated housing 2 and the lens body 3 can be formed as one piece with a corresponding lead frame set 1. Further, in this embodiment, the blind holes 15 are disposed along a peripheral edge of the lens body 3 so as to strengthen the connection of the lens body 3 with the lead frame set 1. The luminance uniformity of this embodiment is also good after testing.

FIG. 12 shows the preferred embodiment of an LED light bar 300 according to this invention. The LED light bar 300 comprises a plurality of interconnected LED packages 600. The number of the LED package 600 may be adjusted according to the requirement. A single insulated bar 200 may be cut into a plurality of insulated housings 2. Similarly, the LED package shown in FIG. 10 or in FIG. 11 may be interconnected to form an LED light bar.

To sum up the preferred embodiment of the lead frame assembly 500 of this invention, because the insulated bars 200 are formed spaced apart from each other along the second direction (II), residual stress and warping problem caused by the difference between thermal expansion coefficients of metal and insulating materials can be reduced. Further, the consumption of the insulating materials can also be minimized to save material costs. Moreover, the connecting structures (connecting pieces 13) of the lead frame sets 1 extend along a direction identical to that of the insulated bar 200 so that the cutting process can be simplified and the cost of cutting tools can be reduced. The insulated bars 200 have the notches 201 so as to expose the connecting pieces 16 between each adjacent two ones of the second lead frames 12. This facilitates cutting of the connecting pieces 16 so that each of the lead frame sets 1 is electrically isolated, testing can be directly conducted on the lead frame assembly 500, and the package testing can be facilitated. Additionally, immediate correction of positions of color coordinates of LED package during light testing can be facilitated, so that accuracy of the position of the color coordinates of a single light emitting diode package can be enhanced.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

What is claimed is:

1. A light emitting diode package, comprising:
a lead frame set including a first lead frame, a second lead frame, at least two first connecting pieces, and at least two second connecting pieces, said first and second lead frames being spaced apart along a straight line, said two first connecting pieces extending outward from two opposite sides of said first lead frame transversely relative to said straight line, said two second connecting pieces extending outward from two opposite sides of said second lead frame transversely relative to said straight line, said first connecting pieces being different in transverse length from said second connecting pieces;
an insulated housing covering said lead frame set and exposing bottom surfaces of said first and second lead frames, each of said first connecting pieces having an end surface flush with one lateral surface of said insulated housing, said insulated housing having a plurality of notches, each of said second connecting pieces protruding from said insulated housing at one of said notches; and
at least one LED die disposed on and connected electrically to said lead frame set.

2. The light emitting diode package of claim 1, wherein said insulated housing further has a recess partially exposing top surfaces of said first and second lead frames, said LED die being disposed on said top surface of one of said first and second lead frames.

3. The light emitting diode package unit of claim 2, wherein said insulated housing further has a filling portion filled into a space between said first and second lead frames, said filling portion protruding from and extending into said top surfaces of said first and second lead frames to partially cover the same.

4. The light emitting diode package of claim 2, wherein said recess has a height ranging from 0.5 to 1.5 times the thickness of said LED die.

5. The light emitting diode package unit of claim 2, further comprising a lens connected to said insulated housing and covering said recess and said LED die.

6. The light emitting diode package of claim 2, further comprising a transparent body filled in said recess, said transparent body having a top surface flush with a top surface of said insulated housing.

7. The light emitting diode package of claim 1, further comprising a lens that is formed integrally as one piece with said insulated housing using a transparent material.

8. The light emitting diode package of claim 1, wherein said first lead frame includes a first base portion having a first protruding portion exposed from said insulated housing along said straight line, said second lead frame including a second base portion having a second protruding portion exposed from said insulated housing along said straight line, said first and second base portions being connected to said insulated housing, said first and second protruding portions being opposite to each other along said straight line.

9. The light emitting diode package of claim 8, wherein said lead frame set further includes a plurality of indentations respectively formed in bottom surfaces of said first and second lead frames at positions corresponding to said first and second protruding portions.

10. The light emitting diode package of claim 9, wherein said lead frame set further includes a plurality of stepped structures respectively formed on at least a portion of a bottom peripheral edge of said first base portion and at least a portion of a bottom peripheral edge of said second base portion.

* * * * *